US006442096B2

(12) United States Patent
Huber

(10) Patent No.: US 6,442,096 B2
(45) Date of Patent: Aug. 27, 2002

(54) FAST ACCESSING OF A MEMORY DEVICE

(75) Inventor: Brian W. Huber, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/876,646

(22) Filed: Jun. 7, 2001

Related U.S. Application Data

(63) Continuation of application No. 09/493,452, filed on Jan. 28, 2000, now Pat. No. 6,259,646.

(51) Int. Cl.[7] ................................................ G11C 8/00
(52) U.S. Cl. ........................... 365/230.01; 365/230.06; 365/236
(58) Field of Search ..................... 365/230.01, 230.02, 365/230.06, 230.08, 240, 235, 238.5, 189.01, 189.02, 189.12, 236

(56) References Cited

U.S. PATENT DOCUMENTS

| | | | |
|---|---|---|---|
| 4,818,932 A | 4/1989 | Odenheimer | 324/121 R |
| 5,235,545 A | 8/1993 | McLaury | 365/189.04 |
| 5,289,413 A | * 2/1994 | Tsuchida et al. | 365/189.02 |
| 5,526,320 A | 6/1996 | Zagar et al. | 365/233.5 |
| 5,598,372 A | 1/1997 | Matsumoto et al. | 365/230.01 |
| 5,625,790 A | 4/1997 | Cutter | 395/431 |
| 5,666,321 A | 9/1997 | Schaefer | 365/233.5 |
| 5,675,549 A | 10/1997 | Ong et al. | 365/233.5 |
| 5,682,354 A | 10/1997 | Manning | 365/233.5 |
| 5,717,652 A | 2/1998 | Ooishi | 365/233 |
| 5,721,859 A | 2/1998 | Manning | 397/421.07 |
| 5,774,412 A | 6/1998 | Raad et al. | 365/230.06 |
| 5,784,705 A | 7/1998 | Leung | 711/169 |
| 5,815,447 A | 9/1998 | Thomann | 365/200 |
| 5,825,711 A | 10/1998 | Manning | 365/230.03 |
| 5,835,401 A | 11/1998 | Green et al. | 365/149 |
| 5,845,315 A | 12/1998 | Cutter | 711/104 |
| 5,850,368 A | 12/1998 | Ong et al. | 365/238.5 |
| 5,870,347 A | 2/1999 | Keeth et al. | 365/230.03 |

(List continued on next page.)

Primary Examiner—Hoai Ho
Assistant Examiner—Thong Le
(74) Attorney, Agent, or Firm—Schwegman, Lundberg, Woessner & Kluth PA

(57) ABSTRACT

Improved methods and structures are provided that allow for fast access of a memory device. Embodiments of a structure include a memory device that comprises a decode logic circuitry that decodes an address. The memory device also includes a counter circuitry coupled to the decode logic circuitry that generates a counter value based on the decoded address. Other embodiments of a structure include a compare circuit that determines whether a page count is complete in a memory structure. The compare circuit includes a holding circuitry that includes a number of latches for holding an encoded version of a memory address. The compare circuit also includes a multiplexing circuitry coupled to the holding circuitry. The multiplexing circuitry receives the encoded version of the memory address from the holding circuitry and a decoded version of the memory address from a decoder, such that the multiplexing circuitry uses the encoded version to select one bit of the decoded version of the memory address to determine whether the page count is complete for the memory structure. Embodiments of the present invention also includes methods, other structures as well as systems incorporating such structures all formed according to the methods provided in this application.

56 Claims, 7 Drawing Sheets

U.S. PATENT DOCUMENTS

| | | | |
|---|---|---|---|
| 5,898,638 A | 4/1999 | Keeth | 365/230.06 |
| 5,901,092 A | 5/1999 | Tran | 365/195 |
| 5,912,860 A | 6/1999 | Schaefer | 365/233.5 |
| 5,946,260 A | 8/1999 | Manning | 365/230.03 |
| 5,949,737 A | 9/1999 | Casper et al. | 365/233.5 |
| 5,956,289 A * | 9/1999 | Norman et al. | 365/233 |
| 5,973,975 A | 10/1999 | Raad | 365/207 |
| 5,991,225 A | 11/1999 | Forbes et al. | 365/230.06 |
| 6,006,303 A | 12/1999 | Barnaby et al. | 710/244 |
| 6,006,313 A | 12/1999 | Fukumoto | 711/211 |
| 6,021,459 A | 2/2000 | Norman et al. | 711/5 |
| 6,049,505 A | 4/2000 | Fister | 365/236 |
| 6,049,855 A | 4/2000 | Jeddeloh | 711/157 |
| 6,078,985 A | 6/2000 | Lakhani et al. | 711/5 |
| 6,160,755 A * | 12/2000 | Norman et al. | 365/233 |
| 6,259,646 B1 * | 7/2001 | Huber | 365/230.01 |

* cited by examiner

FAST ACCESSING OF A MEMORY DEVICE

This application is a Continuation of U.S. Ser. No. 09/493,452 filed Jan. 28, 2000 now is U.S. Pat. No. 6,259,646.

FIELD OF THE INVENTION

The present invention relates generally to memory devices and more particularly, the present invention relates to decoding and counting of memory addresses in such devices.

BACKGROUND OF THE INVENTION

The performance of computer systems has improved dramatically due to a rapid growth in computer architecture design and particularly in the performance of computer memory. However, access times to the data residing in computer memory has not improved at a corresponding rate.

FIG. 1 is a typical memory device. In particular, FIG. 1 illustrates memory device 100 that includes control 38, latch 18, row decode 22, counter 26, column decode 30, memory array 12, input/output (I/O) logic and latches 34 and write drivers and data sense amplifiers 52. Memory device 100 can be coupled to an external microprocessor or memory controller for memory accessing and is used to store data which is accessed via data bus 10. It will be appreciated by those skilled in the art that additional circuitry and control signals can be provided.

For example, for a write operation, an address along wit[0088] data is inputted to memory device 100 through address bus 16 and data bus 10, respectively. The data on data bus 10 is written into memory array 12 at the address given by address bus 16. In particular, row address strobe (/RAS) signal 14, column address strobe (/CAS) signal 24, write enable (/WE) signal 36 and output enable (/OE) signal 42, which are coupled to control 38, latch 18, counter 26 and 1/0 logic and latches 34, control the input and output to and from memory array 12, as is known in the art. Based on these control signals, the address is decoded by row decode 22 and column decode 30 through latch 18 and counter 26, respectively, thereby activating the memory cells that are being written to using write drivers and data sense amplifiers 52, as is known in the art. The data on data bus 10 is then written to these activated memory cells of memory array 12 through I/O bus 32.

Disadvantageously, due to the low latency (i.e., zero clocks) of the write path and the setup requirements of writing to memory array 12, the logic that decodes the column address (i.e., column decode 30) used for enabling the proper write drivers can be in the critical path of memory device 100.

Moreover, for embodiments of memory device 100 that includes compare circuitry to determine whether a page count is complete during a read or write operation, conventional circuitry compares a decoded version of the memory address to a reference version of such a memory address that is also decoded. Disadvantageously, this decode-to-decode compare circuitry requires many gates to perform the compare, thereby decreasing the speed of such a compare and also increasing the size of memory devices using such circuitry. Accordingly, there is a need for a reduction of the criticality of the decode logic path of such memory devices. as well as a faster and smaller compare circuitry to determine whether a page count is complete during read and write operations of such devices. For these and other reasons there is a need for the present invention.

SUMMARY OF THE INVENTION

The above-mentioned problems with access times of memory devices and other problems are addressed by the present invention and will be understood by reading and studying the following specification. Structures and methods are described which accord improved benefits for accessing of memory devices.

In particular, improved methods and structures are provided that reduce the criticality of a decode logic path for a memory device by moving the decode logic circuitry prior to the counter circuitry for a memory device, thereby enabling the decoding of the write drivers and data sense amplifiers during the setup time of a load path of the memory device. Further, improved methods and structures are provided that enable the determination of when a page count is complete in a memory array of a memory device with smaller and faster circuitry than current conventional count complete circuitry.

Embodiments of a structure include a memory device that comprises a decode logic circuitry that decodes an address. The memory device also includes a counter circuitry coupled to the decode logic circuitry that generates a counter value based on the decoded address. Embodiments of the present invention also includes methods, other structures as well as systems incorporating such structures all formed according to the methods provided in this application.

Additionally, other embodiments of a structure include a compare circuit that determines whether a page count is complete in a memory structure. The compare circuit includes a holding circuitry that includes a number of latches for holding an encoded version of a memory address. The compare circuit also includes a multiplexing circuitry coupled to the holding circuitry. The multiplexing circuitry receives the encoded version of the memory address from the holding circuitry and a decoded version of the memory address from a decoder, such that the multiplexing circuitry uses the encoded version to select one bit of the decoded version of the memory address to determine whether the page count is complete for the memory structure.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

Figure 1:
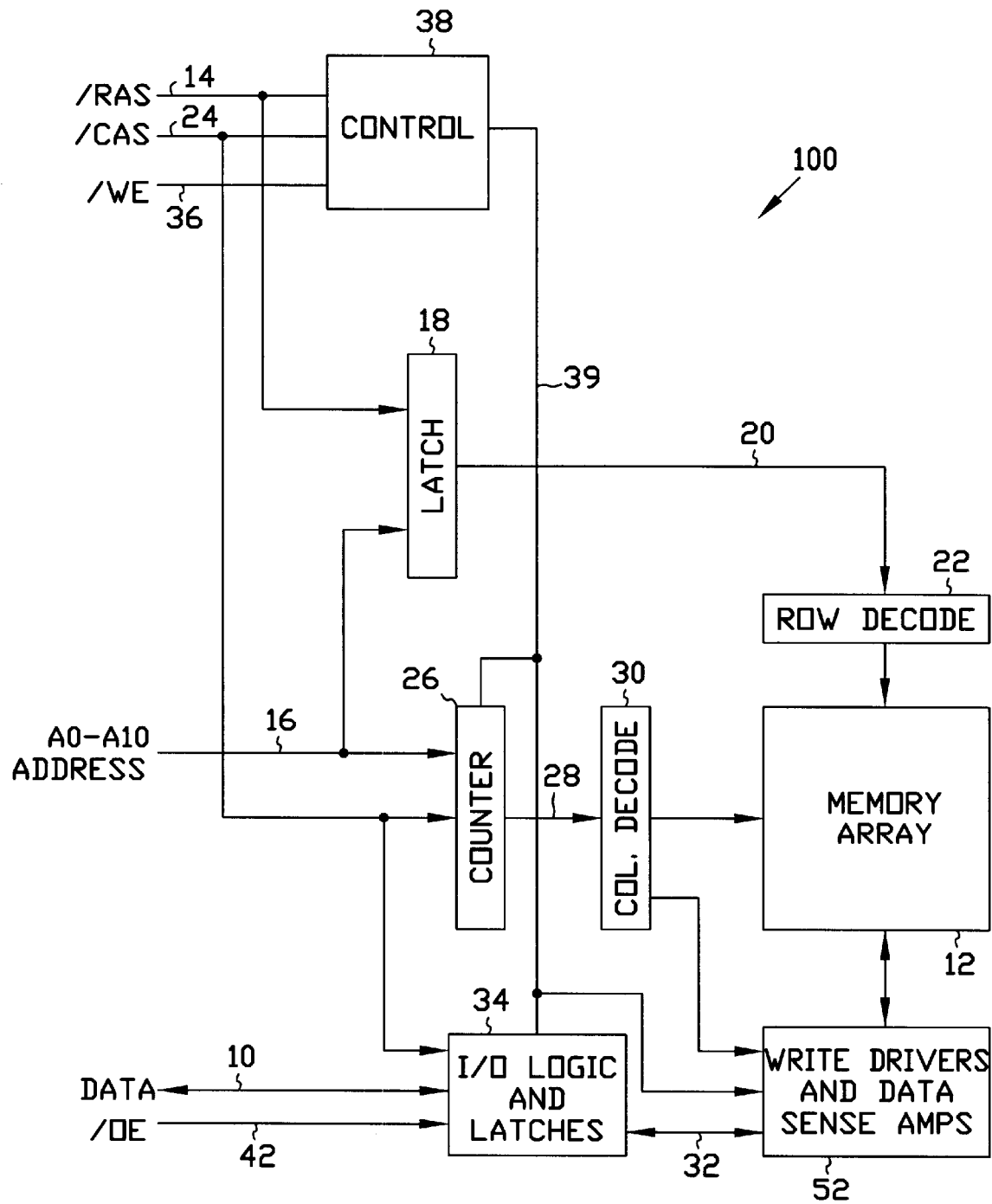
FIG. 1 is a representational diagram of a typical memory device.

Reference numbers refer to the same or equivalent parts of embodiment(s) of the present invention through several of the figures.

DETAILED DESCRIPTION

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Figure 2:
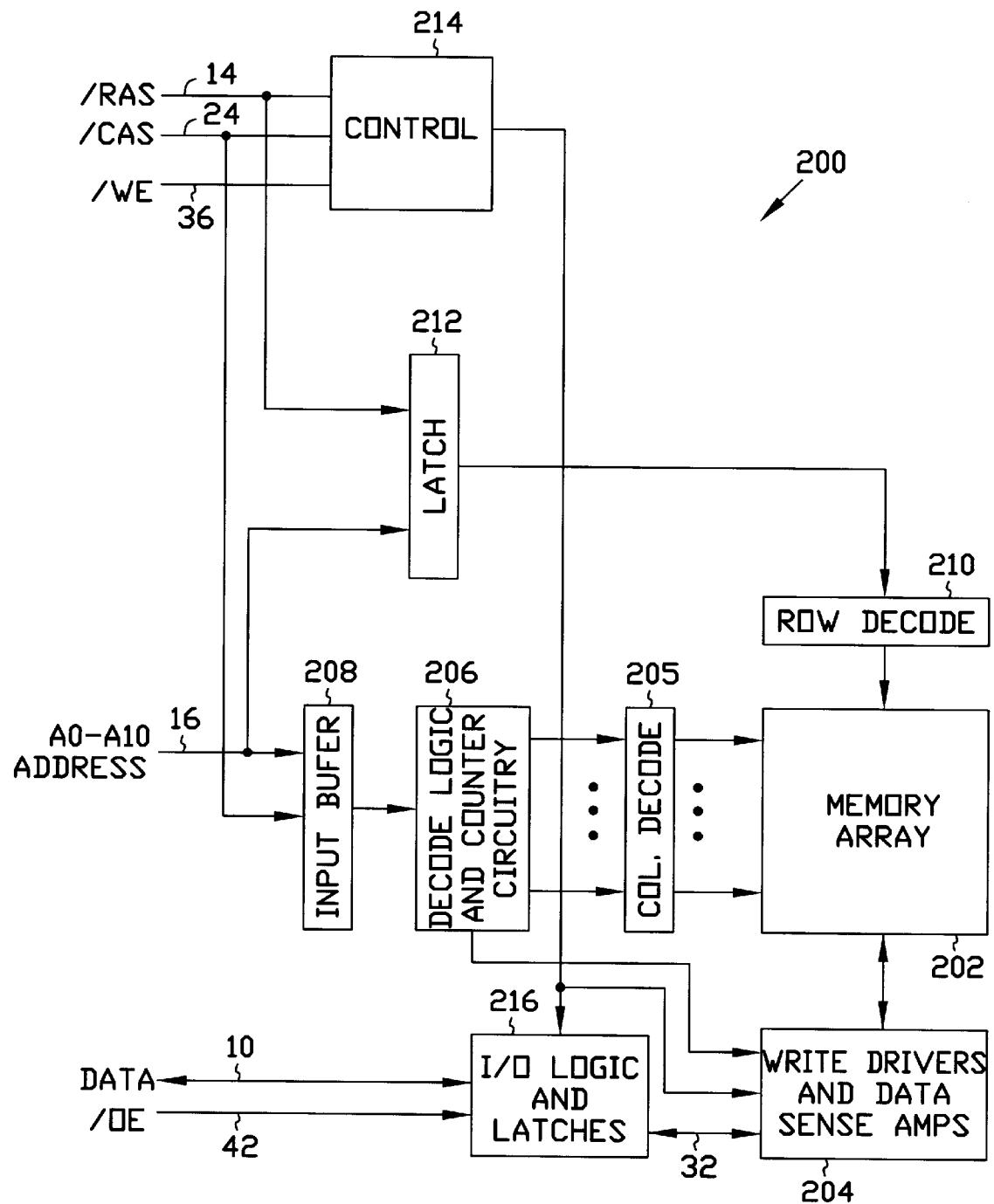
FIG. 2 is a representational diagram of an embodiment of a system that includes embodiments of the present invention.

FIG. 2 is a representational diagram of an illustrative embodiment of a system that includes embodiments of the present invention. In particular, FIG. 2 includes memory device 200 that includes memory array 202, write drivers and data sense amplifiers 204, column decode 205, decode logic and counter circuitry 206, input buffer 208, row decode 210, latch 212, control 214, and input/output (I/O) logic and latches 216. Memory device 200 can be coupled to an external microprocessor or memory controller for memory accessing. Memory device 200 is used to store data which is accessed via data bus 10 based on the address located on address bus 16. It will be appreciated by those skilled in the art that additional circuitry and control signals can be provided.

Memory array 202 is coupled to write drivers and data sense amplifiers 204. In operation, write drivers and data sense amplifiers 204 activate the I/O lines for the memory cells within a memory bank of memory array 202 that are to be written to and read from during write and read operations. Decode logic and counter circuitry 206 is coupled to write drivers and data sense amplifiers 204 as well as to column decode 205. Embodiments of decode logic and counter circuitry 206 are describe below in conjunction with FIGS. 3–8. Input buffer 208 is coupled to decode logic and counter circuitry 206 and buffers the address located on address bus 16. Further, input buffer 208 is coupled to column address strobe (/CAS) line.

Memory array is coupled to row address strobe (/RAS) line through latch 212 and row decode 210 for activating the rows within memory array 202 for writing the data on the data lines. Additionally, control 214 receives the signals on the /RAS line, the /CAS line and the write enable (/WE) line. Control 214 is also coupled to I/O logic and latches 216 and write drivers and data sense amplifiers 204 and transmits a signal for synchronizing and controlling the inputting and outputting of data into and from memory array 202 through I/O logic and latches 216 and write drivers and data sense amplifiers 204. I/O logic and latches 216 is also coupled output enable (/OE) line for controlling the output of the data from memory array 202 through the data lines.

For a write operation, an address along with data is inputted to memory device 200 through address bus 16 and data bus 10, respectively. The data on data bus 10 is written into memory array 202 at the address given by address bus 16. In particular, row address strobe (/RAS) signal 14, column address strobe (/CAS) signal 24, write enable (/WE) signal 36 and output enable (/OE) signal 42, which are coupled to control 214, latch 216, input buffer 208 and I/O logic and latches 216, control the input and output to and from memory array 202. Based on these control signals, the address is decoded by decode logic and counter circuitry 206 and, column decode 205, thereby selecting the memory cells that are being written to. The data on data bus 10 is then written to these selected memory cells of memory array 202.

Figure 3:
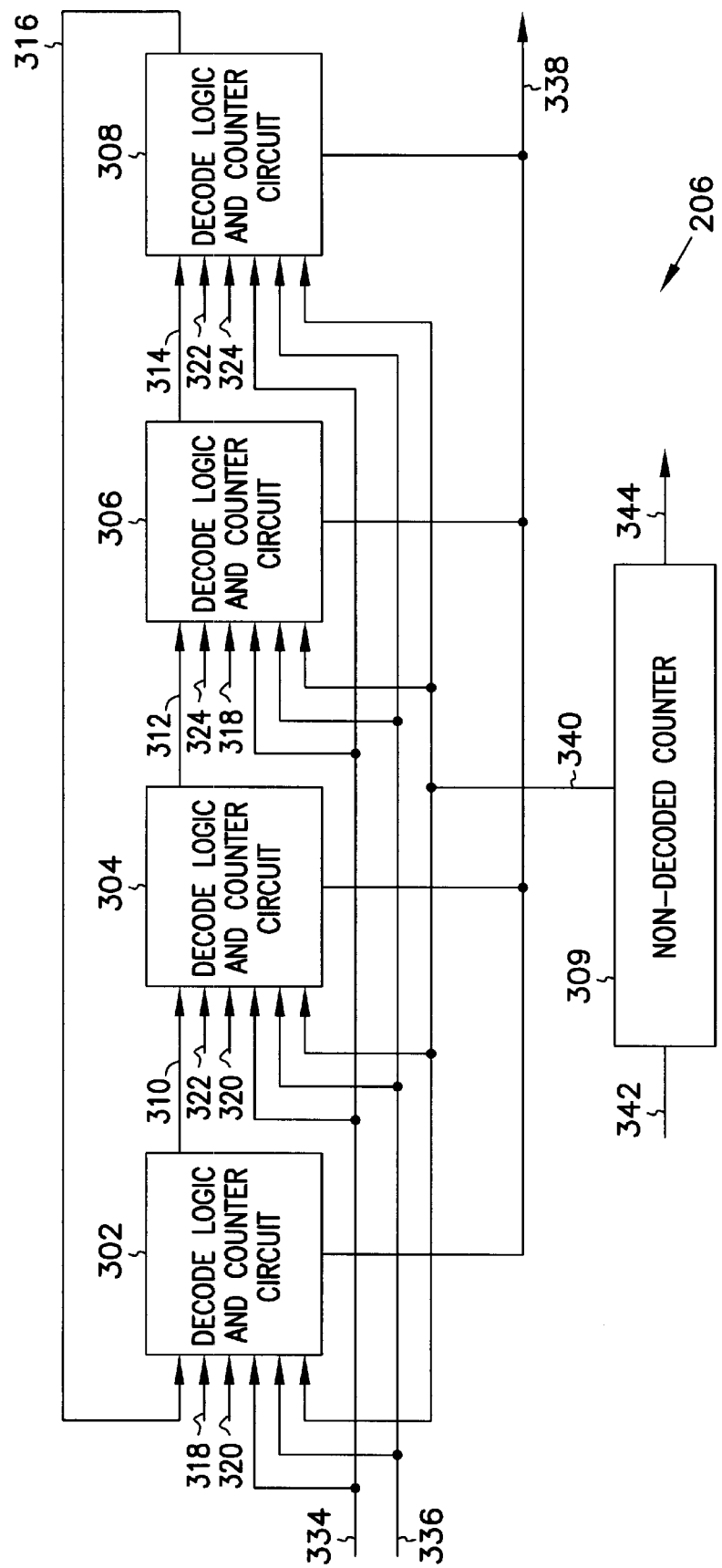
FIG. 3 illustrates an embodiment of a configuration of decode logic and counter circuitry according to the teachings of the present invention.

FIG. 3 illustrates one embodiment of decode logic and counter circuitry 206. FIG. 3 includes non-decoded counter 309 and decode logic and counter circuits 302–308. In particular, decode logic and counter circuits 302–308 are coupled together whereby their configuration creates a decode circuit in conjunction with a four bit shift register (i.e., the counting portion of decode logic and counter circuitry 206). In particular, each of the decode logic and counter circuits 302–308 include decode logic circuitry and a shift register (i.e., counting circuitry). The output of decode logic and counter circuit 302 is coupled to the input of decode logic and counter circuit 304 through first shift bit signal 310. Additionally, the output of decode logic and counter circuit 304 is coupled to the input of decode logic and counter circuit 306 through second shift bit signal 312. The output of decode logic and counter circuit 306 is coupled to the input of decode logic and counter circuit 308 third shift bit signal 314. Further, the output of decode logic and counter circuit 308 is coupled to the input of decode logic and counter circuit 302 fourth shift bit signal 316.

Moreover, inverted first address bit 318 and inverted second address bit 320 are coupled as inputs into decode logic and counter circuit 302. True first address bit 322 and inverted second address bit 320 are coupled as inputs into decode logic and counter circuit 304. Additionally, true second address bit 324 and inverted first address bit 318 are coupled as inputs into decode logic and counter circuit 306. True first address bit 322 and true second address bit 324 are coupled as inputs into decode logic and counter circuit 308.

Further, non-decoded counter 309 is coupled to decode logic and counter circuits 302–308 through carry-in signal 340. Carry-in signal 340, as subsequently described in conjunction with FIG. 4, determines whether to shift the bits. The input of non-decoded counter circuit 309 is coupled to lower order address bits 342, while an output of non-decoded counter circuit 309 is coupled to lower order counted address signal 344. Lower order counted address signal 344 is coupled to a column decode of a memory for the decoding of these lower order address bits.

However, there can be variations of and modifications to the embodiment illustrated in FIG. 3 while still falling within the scope of the present invention. For example, the two address bits from among the address bits being decoded by decode logic and counter circuits 302–308 can be the lower (not the higher) order bits of such an address. Accordingly, instead of a carry-in signal coming from non-decoded counter 309 into decode logic and counter circuits 302–308, a logic one signal would be inputted into decode logic and counter circuits 302–308, in place of a carry-in signal, thereby enabling decode logic and counter circuits 302–308 to shift each time. Moreover in such an embodiment, a carry-out signal would be outputted from decode logic and counter circuits 302–308 into non-decoded counter 309 to drive the higher order bits of the address.

The address, which includes first and second address bits as well as lower order address bits, determines the location within a memory array of a memory device for reading and writing data therefrom. The above-described first and second address bits are those bits within such an address that control the activation of the data sense amplifiers and write drivers of such a memory device using decode logic and counter circuitry 206.

In one such embodiment, these two address bits control sixteen write drivers for a particular bank within a memory array of such a memory device. Accordingly, true and inverted versions of these two address bits are inputted into decode logic and counter circuitry 206 with one permutation of the true and inverted versions being inputted into one of the decode logic and counter circuits for each of decode logic and counter circuits 302–308. For example, one embodiment of the relationship between the true or inverted state of these address bits and each of decode logic and counter circuits 302–308 is illustrated by Table 1, in which the address bits inputted into the decode logic and counter circuits are true or inverted versions of the first and second address bits. Table 1 depicts the case where the first and second address bits are set to low (e.g., zero).

TABLE 1

| first address bit set to 0 | second address bit set to 0 | decode logic and counter circuit |
|---|---|---|
| 1 (inverted first address bit 318) | 1 (inverted second address bit 320) | 302 |
| 0 (true first address bit 322) | 1 (inverted second address bit 320) | 304 |
| 1 (inverted first address bit 318) | 0 (true second address bit 324) | 306 |
| 0 (true first address bit 322) | 0 (true second address bit 324) | 308 |

Further, first configuration signal 334 and second configuration signal 336 are also coupled as inputs into each of the decode logic and counter circuits 302–308. These two configurations signals control how the write drivers and data sense amplifiers for a particular bank within a memory array of such a memory device are configured.

For example, in one embodiment, the memory device is configured in a by-four configuration using first and second configuration signals 432 and 436. A by-four configuration translates into the simultaneous activation of four of the sixteen write drivers or data sense amplifiers for access of associated memory cells within the memory array. In an alternative embodiment, the memory device is configured in a by-eight configuration using first and second configuration signals 432 and 436. Therefore, eight of the sixteen write drivers or data sense amplifiers are simultaneously activated for access of associated memory cells within the memory array. In another embodiment, the memory device is configured in a by-sixteen configuration using first and second configuration signals 432 and 436. Accordingly, all sixteen of the write drivers or data sense amplifiers are simultaneously activated at once for access of associated memory cells within the memory array.

In one embodiment, first and second configuration signals 432 and 436 are set as illustrated in Table 2, according to the above-described configurations:

TABLE 2

| first config. signal 432 | second config. signal 436 | type of configuration |
|---|---|---|
| 0 | 0 | by-four configuration |
| 1 | 0 | by-eight configuration |
| 1 | 1 | by-sixteen configuration |

Additionally, tables 3–5 are truth tables of the decode logic based on the two address bits and the two configurations signals for a by-four, by-eight and by-sixteen configurations, respectively.

TABLE 3

|  | decode logic and counter circuit 302 | decode logic and counter circuit 304 | decode logic and counter circuit 306 | decode logic and counter circuit 308 |
|---|---|---|---|---|
| true or inverted state of 1st address bit set to 1 | 0 (inverted) | 1 (true) | 0 (inverted) | 1 (true) |
| true or inverted of 2nd address bit set to 1 | 0 (inverted) | 0 (inverted) | 1 (true) | 1 (true) |
| 1st config signal | 0 | 0 | 0 | 0 |
| 2nd config signal | 0 | 0 | 0 | 0 |
| shift register loaded with: | 0 | 0 | 0 | 1 |

Taking the case of first and second address bits being set to high, Table 3 shows the true and inverted states of this address bit case as seen by decode logic and counter circuits 302–308 through signals 318–324. As illustrated in Table 3, these loaded shift bits to be shifted through the counting circuitry (i.e., shift register) have one active high shift bit that activates four write drivers or data sense amplifiers at one time.

Table 4 is a truth table of the output of the decode logic after passing the output through an inverter for a by-eight configuration:

TABLE 4

|  | decode logic and counter circuit 302 | decode logic and counter circuit 304 | decode logic and counter circuit 306 | decode logic and counter circuit 308 |
|---|---|---|---|---|
| true or inverted state of 1st address bit set to 1 | 0 (inverted) | 1 (true) | 0 (inverted) | 1 (true) |
| true or inverted of 2nd address bit set to 1 | 0 (inverted) | 0 (inverted) | 1 (true) | 1 (true) |
| 1st config signal | 1 | 1 | 1 | 1 |
| 2nd config signal | 0 | 0 | 0 | 0 |
| shift register loaded with: | 0 | 1 | 0 | 1 |

Taking the case of first and second address bits being set to high, Table 4 shows the true and inverted states of this address bit case as seen by decode logic and counter circuits 302–308 through signals 318–324. As illustrated in Table 4, these shift bits to be shifted through the counting circuitry (i.e., shift register) have two active high shift bits that activate eight write drivers or data sense amplifiers at one time.

Table 5 is a truth table of the output of the decode logic after passing the output through an inverter for a by-sixteen configuration:

TABLE 5

|  | decode logic and counter circuit 302 | decode logic and counter circuit 304 | decode logic and counter circuit 306 | decode logic and counter circuit 308 |
|---|---|---|---|---|
| true or inverted state of 1st address bit set to 1 | 0 (inverted) | 1 (true) | 0 (inverted) | 1 (true) |
| true or inverted of 2nd address bit set to 1 | 0 (inverted) | 0 (inverted) | 1 (true) | 1 (true) |
| 1st config signal | 1 | 1 | 1 | 1 |
| 2nd config signal | 1 | 1 | 1 | 1 |
| shift register loaded with: | 1 | 1 | 1 | 1 |

Taking the case of first and second address bits being set to high, Table 5 shows the true and inverted states of this address bit case as seen by decode logic and counter circuits 302–308 through signals 318–324. As illustrated in Table 5, these loaded shift bits to be shifted through the counting circuitry (i.e., shift register), has four active high shift bits that activate sixteen write drivers or data sense amplifiers at one time.

Embodiments of decode logic and counter circuitry 206 operate in both a load and counting (i.e., shifting) mode. Decode logic and counter circuitry 206 operates in a load mode when a new address is being loaded into the memory device while operating in a counting mode when the current address is being incremented for activation of possibly different data sense amplifiers or write drivers for a particular bank of a memory array of a memory device depending on the configurations of such data sense amplifiers and write drivers.

During a load operation, the two address bits along with the two configuration signals are decoded to form the shift bits that will be shifted through decode logic and counter circuits 302–308. During a counting operation, the shift bits created during the decoding are shifted through the decode logic and counter circuits. Additionally after a shift, each of the shift bits are outputted from each of the decode logic and counter circuits to output signal line 338. Output signal line 338 is coupled to the data sense amplifiers and the write drivers of the memory device. Accordingly, based on these four shift bits, the appropriate data sense amplifiers or write drivers, depending on whether the memory array is being read from or written to, are activated.

Advantageously, embodiments of decode logic circuitry in conjunction with a four bit shift register and equivalents thereof enable the decoding of portions of the address signal prior to the counting circuitry. Accordingly, the decode logic for the write drivers and data sense amplifiers of a memory device occur during setup time of the column load path, thereby reducing the amount of access time during read and write operations of a memory array of a memory device.

Figure 4:
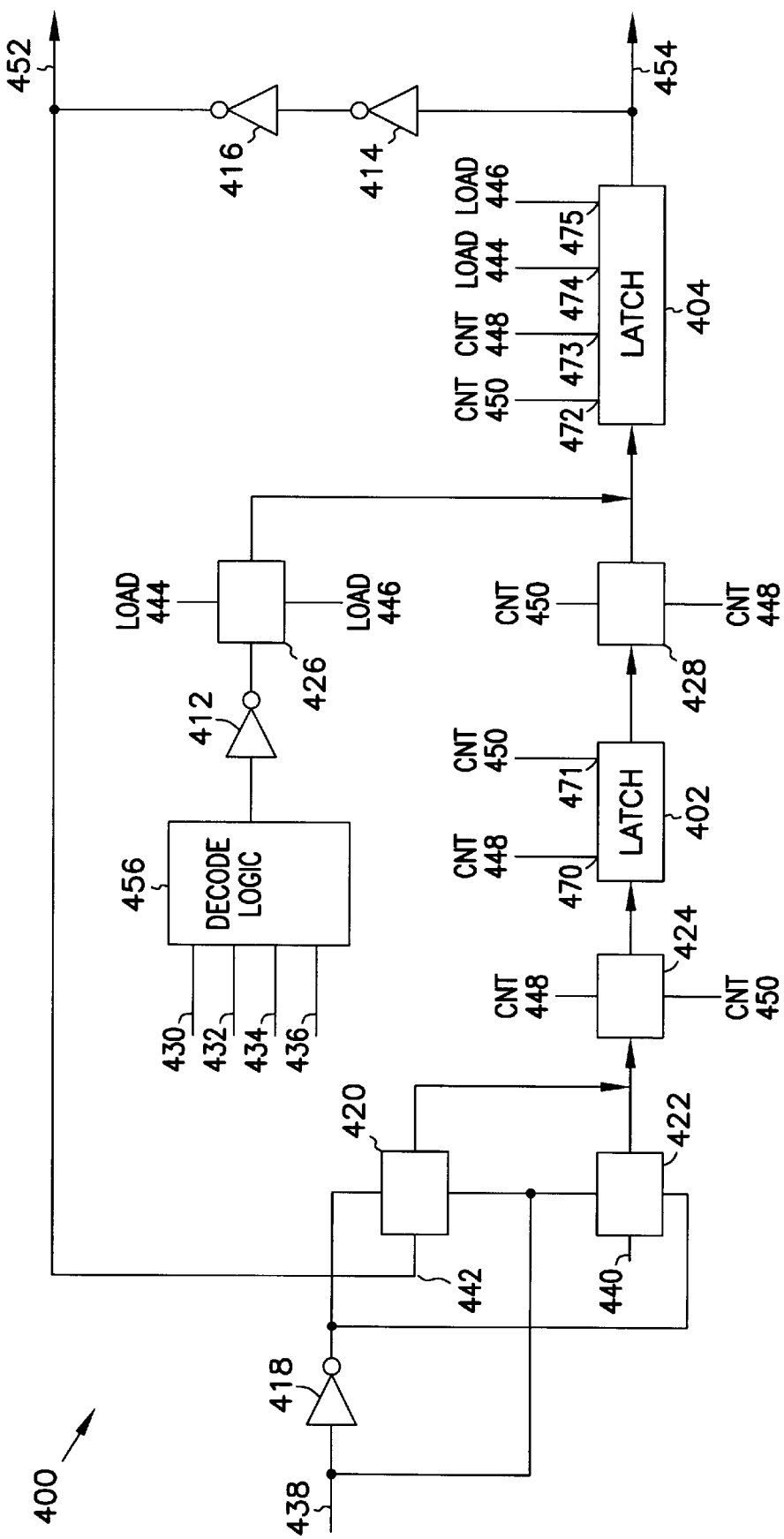
FIG. 4 illustrates an embodiment of decode logic and counter circuit according to the teachings of the present invention.

FIG. 4 illustrates one embodiment of the decode logic and counter circuits of FIG. 3 (i.e., decode logic and counter circuits 302–308). In particular, decode logic and counter circuit 400 of FIG. 4 includes latches 402 and 404, inverters 412–418, decode logic circuit 456 and pass gates 420–428. The input and output signals into decode logic and counter circuit 400 include first address bit 430, first configuration signal 432, second address bit 434, second configuration signal 436, carry-in signal 438, shift bit 440, latched signal 442, first load signal 444, second load signal 446, first counter signal 448, second counter signal 450, output shift signal 452 and output signal 454.

First address bit 430, first configuration signal 432, second address bit 434 and second configuration signal 436 are coupled to the input of decode logic circuit 456. The output of decode logic circuit 456 is coupled to the input of inverter 412, whose output is coupled to the data input of pass gate 426. First and second load signal 444 and 446 are coupled to the control inputs of pass gate 426, and the output of pass gate 426 is coupled to the data input of latch 404.

Latched signal 442 is coupled to the data input of pass gate 420, whose output is coupled to the data input of pass gate 424. Moreover, carry-in signal 438 is coupled to the input of inverter 418, whose output is coupled to a control input of pass gate 420 and a control input of pass gate 422. Further, carry-in signal 438 is coupled to another control input of pass gate 420 and another control input of pass gate 422. Shift bit 440 is coupled to the data input of pass gate 422, whose output is coupled to the data input of pass gate 424. First counter signal 448 and second counter signal 450 are coupled to the control inputs of pass gate 424. The output of pass gate 424 is coupled to the data input of latch 402.

First and second counter signals 448 and 450 are coupled to the control inputs of latch 402, while the output of latch 402 is coupled to the data input of pass gate 428. First and second counter signals 448 and 450 are also coupled to the control inputs of pass gate 428, and the output of pass gate 428 is coupled to the data input of latch 404. First and second counter signals 448 and 450 and first and second load signals 444 and 446 are coupled to the control inputs of latch 404. Additionally, the output of latch 404 is coupled to the input of inverter 404 and is also output signal 454. The output of inverter 414 is coupled to the input of inverter 416, while the output of inverter 416 is output shift signal 452.

Figure 5:
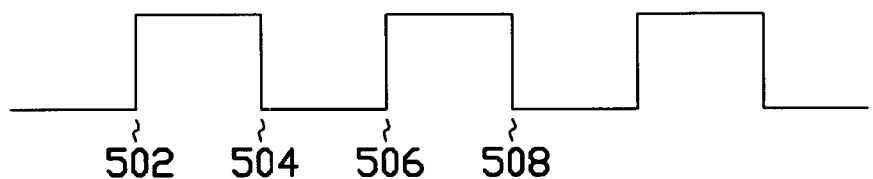
FIG. 5 is a timing diagram to help illustrate embodiments of the present invention.

FIG. 5 is a timing diagram to help illustrate an example of operation of decode logic and counter circuit 400 of FIG. 4. In particular, FIG. 5 is a timing diagram of a timing signal used in conjunction with embodiments of decode logic and counter circuit 400 of FIG. 4. In operation, first and second load signals 444 and 446 and first and second counter signals 448 and 450 are mutually exclusive and indicate if a new address is being loaded or the current address is incremented, respectively. During a load operation, the upper two bits of the new address (i.e., first and second address bits 430 and 434) along with the configurations signals (i.e., first and second configuration signals 432 and 436) are decoded through decode logic circuit 456. In one embodiment, first and second address bits 430 and 434 are those address bits that control the activation of the write drivers and data sense amplifiers of a memory device using decode logic and counter circuit 400, as described above in conjunction with FIG. 3. In one embodiment, first and second configuration signals 432 and 436 control the configuration of the write drivers and data sense amplifiers of a memory device using decode logic and counter circuit 400, as described above in conjunction with FIG. 3.

Figure 6:
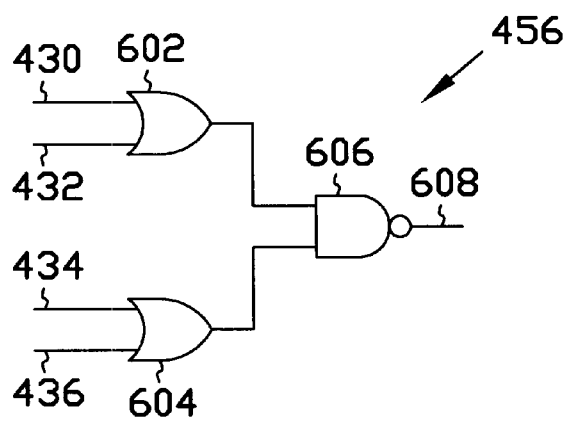
FIG. 6 illustrates an embodiment of a decode logic circuit according to the teachings of the present invention.

FIG. 6 illustrates one embodiment of decode logic circuit 456. In particular, decode logic circuit 456 includes OR gates 602 and 604 and NAND gate 606, which outputs output signal 608. First address bit 430 and first configuration signal 432 are coupled to the inputs of OR gate 602, whose output is coupled to an input of NAND gate 606. Further, second address bit 434 and second configuration signal 436 are coupled to the inputs of OR gate 604, whose output is coupled to an input of NAND gate 606. The output of NAND gate 606 (i.e., output signal 608) is the output of decode logic circuit 456.

Therefore, four inputs based on the two address bits and the two configurations signals generates one shift bit for the decode logic and counter circuit that will be used in conjunction with the other three decode logic and counter circuits as a four bit shift register. In other words, each of the four decode logic and counter circuits of FIG. 3 generates a decoded shift bit to determine the activation of the data sense amplifiers and write drivers of a memory device using embodiments of the present invention.

Once decode logic circuit 456 processes first address bit 430, first configuration signal 432, second address bit 434 and second configuration signal 436, as described above in conjunction with FIG. 4, the signal is outputted to inverter 412, which inverts and transmits the signal to pass gate 426.

Figure 7:
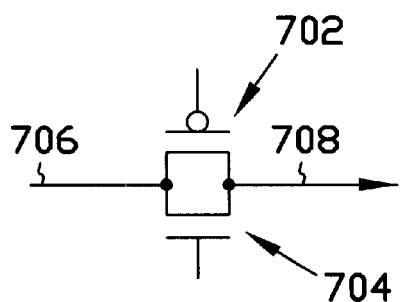
FIG. 7 illustrates an embodiment of a pass gate according to the teachings of the present invention.

FIG. 7 illustrates one embodiment of pass gates 420–428 (i.e., pass gate 700). In particular, pass gate 700 includes p-channel transistor 702 and n-channel transistor 704. In operation, pass gate 700 passes input signal 706 to the output as output signal 708 when an active low signal is on the gate of p-channel transistor 702 and when an active high signal is on the gate of n-channel transistor 704.

Returning to FIG. 4, latch 404 passes data from its input to its output if either (1) the signal to control input 472 is low and the signal to control input 473 is high or (2) the signal to control input 474 is low and the signal to control input 475 is high. Further, latch 402 latches data from its input to its output if the signal to control input 470 is low and the signal to control input 471 is high.

Returning to FIG. 5, the following is an example of how decode logic and counter circuit 400 operates through transitions between load and counting modes. At timing point 502, decode logic and counter circuit 400 performs a load operation. Accordingly, this causes first and second load signals 444 and 446 to be low and high, respectively. Moreover, this causes first and second count signals 448 and 450 to be low and high, respectively. Accordingly, this signal configuration activates pass gates 424 and 426, while inactivating pass gate 428. Moreover, this signal configuration causes latches 402 and 404 to pass their inputs to their outputs. The signal outputted from decode logic circuit 456, therefore, is passed to the data input of latch 404 through inverter 412.

Because this is a load operation, load signal 444 is low and load signal 446 is high; therefore, this causes latch 404 to pass data from the output of pass gate 426 to its data output. This output signal from latch 404 is then transmitted from decode logic and counter circuit 400 as output signal 454 as well as output shift signal 452 through inverters 414 and 416. Referring back to FIG. 3, output signal 454 for each of the decode logic and counter circuits 302–308 are those signals being transmitted to output signal line 338 to the data sense amplifiers and write drivers of a memory device using embodiments of the present invention. Moreover, output shift signal 452 is retransmitted as signal 442.

At timing point 504, decode logic and counter circuit 400 transitions to a second phase of the load mode. Accordingly, this causes first and second count signals 448 and 450 to be low and high, respectively. Moreover, this causes first and second load signals 444 and 446 to be high and low, respectively. Accordingly, this signal configuration activates pass gate 424, while inactivating pass gates 426 and 428. Moreover, this signal configuration causes latch 404 to holds it last output state, while causing latch 402 to pass its input to its output. Therefore, pass gate 424 passes either signal 442 or shift bit 440 to latch 402 depending on the value of carry-in signal 438.

In particular, carry-in signal 438 determines whether pass gate 420 or pass gate 422 passes a signal to pass gate 424. In other words, the activation of pass gate 420 and pass gate 422 are mutually exclusive. In particular, when active, carry-in signal 438, which is an active low signal, activates pass gate 422. This activation of pass gate 422 passes shift bit 440 to pass gate 424. Shift bit 440 is the signal coming from a previous decode logic and control circuit in the daisy chain configuration, described above in conjunction with FIG. 3. For example, the incoming shift bit for decode logic and counter circuit 304 is the output shift signal from decode logic and counter circuit 302.

In contrast, carry-in signal 438 activates pass gate 420 when such a signal is inactive. This activation of pass gate 420 passes the output from inverter 416. Accordingly, pass gate 420 passes the output from latch 404 to pass gate 424. In other words, there is no shifting of bits among the four-bit register unless the carry-in signal is active. Pass gate 424 passes one of the two signals depending on whether or not the four-bit shift register is shifting.

Returning to the timing diagram of FIG. 5, at timing point 506 decode logic and counter circuit 400 transitions to the counting mode. First and second count signals 448 and 450 transition back to high and low, respectively. Moreover, first and second load signals 444 and 446 remain at high and low, respectively. Accordingly, this signal configuration activates pass gate 428, while inactivating pass gates 424 and 426. Further, this signal configuration causes latch 402 to hold its last output state, while causing latch 404 to pass its input to its output.

Therefore, latch 402 outputs its output to pass gate 428. In turn, pass gate 428 passes this signal to the data input of latch 404. Latch 404 then passes this signal to its data output. This output signal of latch 404 is output signal 454 as well as shifted output signal 452 through inverters 414 and 416.

At timing point 508, decode logic and counter circuit 400 transitions to a second phase of the counting mode, wherein first and second count signals 448 and 450 transition back to low and high, respectively. Moreover, first and second load signals 444 and 446 remain at high and low, respectively. Accordingly, this signal configuration activates pass gate 424, while inactivating pass gates 426 and 428. Moreover, this signal configuration causes latch 404 to hold its last output state, while causing latch 402 to pass its input to its output.

Therefore, pass gate 424 passes either signal 442 or shift bit 440 to latch 402 depending on the value of carry-in signal 438 as described above in conjunction with timing point 504. Decode logic and counting circuit 400 continues between the configurations described in conjunction with timing points 506 and 508 until the mode switches from counting back to load, thereby causing a new address to be loaded and decoded, as previously described. Embodiments of the present invention are not limited by the above-described example as the transitions between the load and counting modes can vary from the example illustrated.

Figure 8:
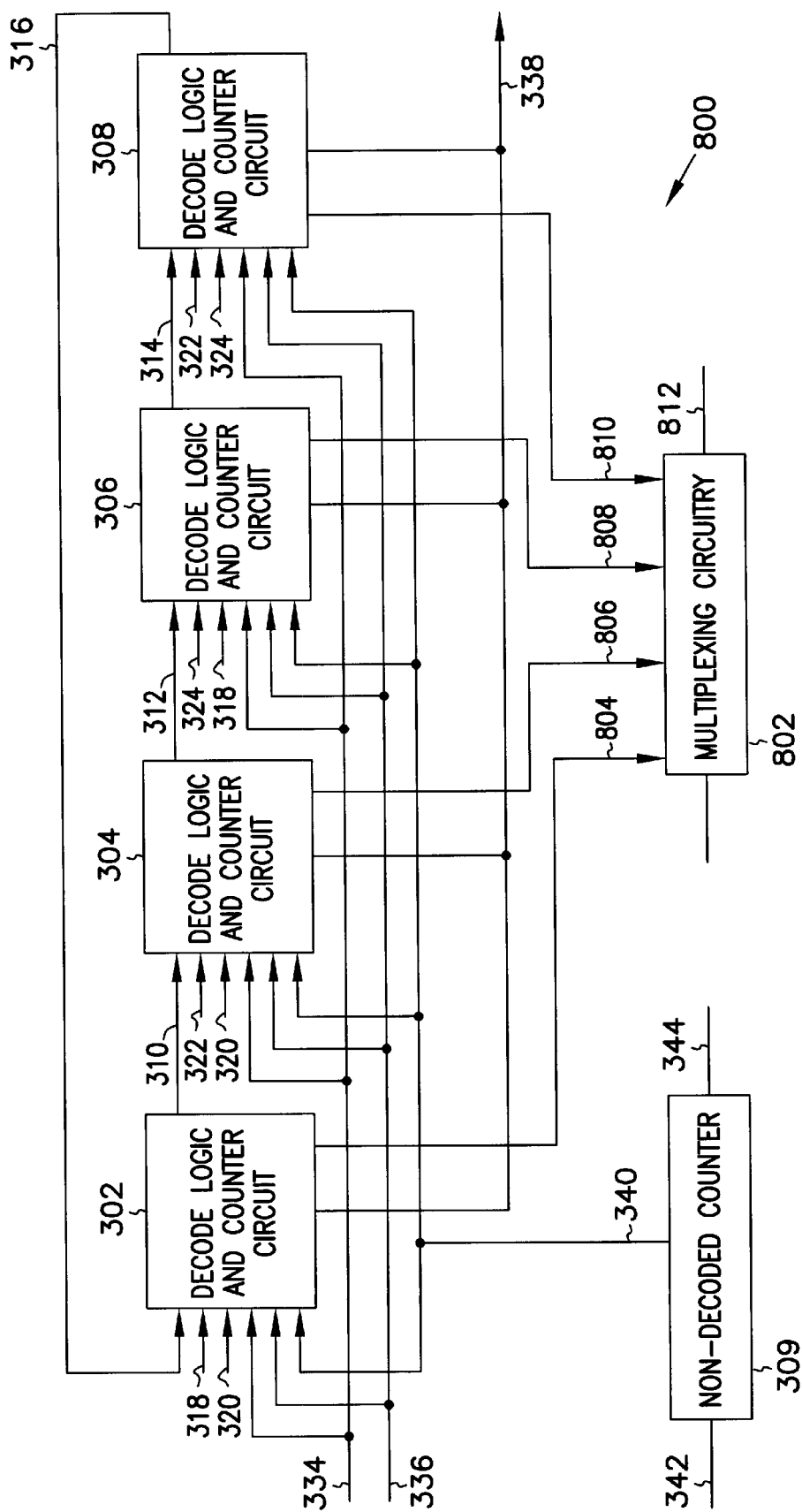
FIG. 8 illustrates an embodiment of a configuration of decode logic and counter circuitry according to the teachings of the present invention.

In one embodiment illustrated in FIG. 8, decode logic and counter circuitry 206 includes multiplexing circuitry coupled to the decode logic and counter circuits that determines whether counting by the counting circuitry is complete. In particular, FIG. 8 includes decode logic and counter circuits 302–308, as previously described in FIG. 3, and multiplexing circuitry 802. Output signals 804–810 from decode logic and counter circuits 302–308 are coupled as inputs to multiplexing circuitry 802. Additionally, output signal 812 is outputted from multiplexing circuitry 802.

In one embodiment, output signal 812 is a signal indicating if the count is complete for the two address bits inputted into decode logic and counter circuitry 206. In one such embodiment, output signal 812 is combined with other count complete signals for the other address bits (e.g., lower order address bits 344 from FIG. 3) for the incoming address in order to determine if the counting is complete for this page in a memory array. In one embodiment, if these count complete signals are active high signals, such signals could be inputted into an AND gate wherein a high output from the AND gate indicates that the count is complete for the current page being read from or written to in the memory array.

Figure 9:
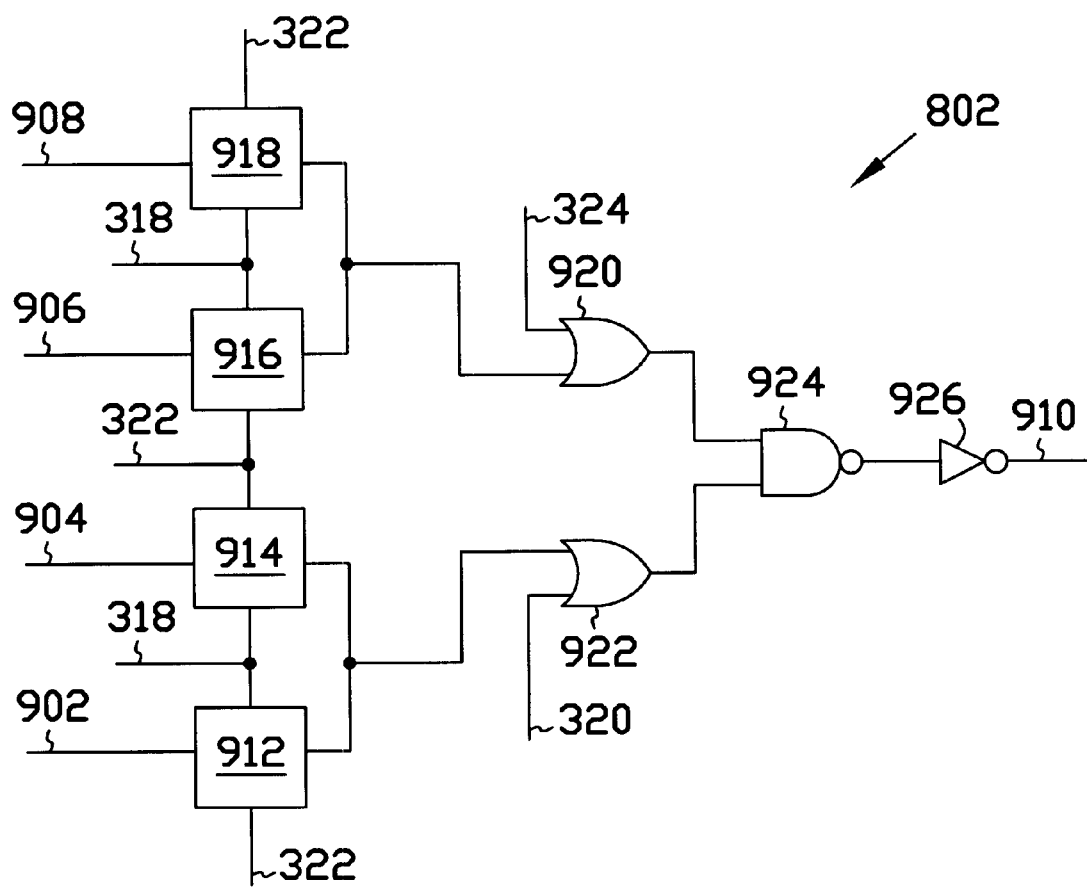
FIG. 9 illustrates an embodiment of a multiplexing circuitry according to the teachings of the present invention.

One embodiment of multiplexing circuitry 802 is illustrated in FIG. 9. In particular, FIG. 9 includes pass gates 912–918, OR gates 920–922, NAND gate 924 and inverter 926. Input and output signals into and out from multiplexing circuitry 802 of FIG. 9 include shift bit signals 902–908, inverted first address bit 318, true first address bit 322, inverted second address bit 320, true second address bit 324 and output signal 910.

Shift bit signal 902 is coupled to the data input of pass gate 912, and shift bit signal 904 is coupled to the data input of pass gate 914. Additionally, shift bit signal 906 is coupled to the data input of pass gate 916, and shift bit signal 908 is coupled to the data input of pass gate 918. Further, true first address bit 322 is coupled to the lower control input of pass gate 912, the upper control input of pass gate 914, the lower control input of pass gate 916 and the upper control input of pass gate 918. Inverted first address bit 318 is coupled to the upper control input of pass gate 912, the lower control input of pass gate 914, the upper control input of pass gate 916 and the lower control input of pass gate 918.

Moreover, the data outputs of pass gates 912 and 914 are coupled to an input of OR gate 922, and the data output of pass gates 916 and 918 are coupled to an input of OR gate 920. Inverted second address bit 320 is coupled to a second input of OR gate 922, and true second address bit 324 is coupled to a second input of OR gate 920. The outputs of OR gates 920–922 are coupled to the inputs of NAND gate 924. Further, the output of NAND gate 924 is coupled to the input of inverter 926, whose output is output signal 910.

In operation, two of the four shift bit signals 902–908 are passed through pass gates 912–918 depending on inverted and true first address bits 318 and 322. One embodiment of pass gates 912–918 is illustrated in FIG. 7. Accordingly, a low signal on the upper control input in combination with a high signal on the lower control input of pass gates 912–918 activates such gates.

Therefore, when inverted first address bit 318 is high and true first address bit 322 is low, pass gates 914 and 918 are activated, and pass gates 912 and 916 are inactivated, thereby passing shift bit signals 904 and 908 to the inputs of OR gates 922 and 920, respectively. Alternatively, when inverted first address bit 318 is low and true first address bit 322 is high, pass gates 912 and 916 are activated, and pass gates 914 and 918 are inactivated, thereby passing shift bit signals 902 and 906 to the inputs of OR gates 922 and 920, respectively.

Tables 6–8 illustrate the operation of multiplexing circuitry 802 of FIG. 9 for a by-four configuration, by-eight configuration and by-sixteen configuration, respectively.

TABLE 6

| shift bit signal 908 | shift bit signal 906 | shift bit signal 904 | shift bit signal 902 | inverted first address bit 318 | true first address bit 322 | inverted second address bit 320 | true second address bit 324 | output 910 |
|---|---|---|---|---|---|---|---|---|
| 0 | 0 | 0 | 1 | 0 | 1 | 0 | 1 | 1 |
| 0 | 0 | 0 | 1 | 0 | 1 | 1 | 0 | 0 |

TABLE 6-continued

| shift bit signal 908 | shift bit signal 906 | shift bit signal 904 | shift bit signal 902 | inverted first address bit 318 | true first address bit 322 | inverted second address bit 320 | true second address bit 324 | output 910 |
|---|---|---|---|---|---|---|---|---|
| 0 | 0 | 0 | 1 | 1 | 0 | 0 | 1 | 0 |
| 0 | 0 | 0 | 1 | 1 | 0 | 1 | 0 | 0 |
| 1 | 0 | 0 | 0 | 0 | 1 | 0 | 1 | 0 |
| 1 | 0 | 0 | 0 | 0 | 1 | 1 | 0 | 0 |
| 1 | 0 | 0 | 0 | 1 | 0 | 0 | 1 | 0 |
| 1 | 0 | 0 | 0 | 1 | 0 | 1 | 0 | 1 |
| 0 | 1 | 0 | 0 | 0 | 1 | 0 | 1 | 0 |
| 0 | 1 | 0 | 0 | 0 | 1 | 1 | 0 | 1 |
| 0 | 1 | 0 | 0 | 1 | 0 | 0 | 1 | 0 |
| 0 | 1 | 0 | 0 | 1 | 0 | 1 | 0 | 0 |
| 0 | 0 | 1 | 0 | 0 | 1 | 0 | 1 | 0 |
| 0 | 0 | 1 | 0 | 0 | 1 | 1 | 0 | 0 |
| 0 | 0 | 1 | 0 | 1 | 0 | 0 | 1 | 1 |
| 0 | 0 | 1 | 0 | 1 | 0 | 1 | 0 | 0 |

Table 6 illustrates operation of a by-four configuration of multiplexing circuitry 802. For a by-four configuration, as described above in conjunction with FIG. 4, one of the four shift bit signals is a high value.

In particular, the following example illustrates the first row of inputs and outputs for Table 6. Accordingly, pass gates 912 and 916 pass shift bit signals 902 and 906, respectively, to the inputs of OR gates 922 and 920, respectively. Additionally, because inverted and true second address bits 320 and 324 have low and high values, respectively, the output from OR gates 922 and 920 result in an output signal with a high value. As illustrated by Table 6, the count is complete for these two address bits after every fourth shift.

Table 7 illustrates operation of a by-eight configuration of multiplexing circuitry 802. For a by-four configuration, as described above in conjunction with FIG. 4, two of the four shift bit signals are high values. As illustrated by Table 7, the count is complete after every second shift of these two address bits.

TABLE 7

| shift bit signal 908 | shift bit signal 906 | shift bit signal 904 | shift bit signal 902 | inverted first address bit 318 | true first address bit 322 | inverted second address bit 320 | true second address bit 324 | output 910 |
|---|---|---|---|---|---|---|---|---|
| 0 | 1 | 0 | 1 | 0 | 1 | 0 | 1 | 1 |
| 0 | 1 | 0 | 1 | 0 | 1 | 1 | 0 | 1 |
| 0 | 1 | 0 | 1 | 1 | 0 | 0 | 1 | 0 |
| 0 | 1 | 0 | 1 | 1 | 0 | 1 | 0 | 0 |
| 1 | 0 | 1 | 0 | 0 | 1 | 0 | 1 | 0 |
| 1 | 0 | 1 | 0 | 0 | 1 | 1 | 0 | 0 |
| 1 | 0 | 1 | 0 | 1 | 0 | 0 | 1 | 1 |
| 1 | 0 | 1 | 0 | 1 | 0 | 1 | 0 | 1 |

For a by-sixteen configuration as illustrated by Table 8, because shift bit signals 902–908 are always high values, the values of inverted and true second address bits 320 and 324 are irrelevant as the output from OR gates 920 and 922 are always high values. Accordingly, the output of multiplexing circuitry 802 is always a high value in a by-sixteen configuration. In other words, the count is complete each time for these two address bits.

TABLE 8

| shift bit signal 908 | shift bit signal 906 | shift bit signal 904 | shift bit signal 902 | inverted first address bit 318 | true first address bit 322 | inverted second address bit 320 | true second address bit 324 | output 910 |
|---|---|---|---|---|---|---|---|---|
| 1 | 1 | 1 | 1 | 0 | 1 | 0 | 1 | 1 |
| 1 | 1 | 1 | 1 | 0 | 1 | 1 | 0 | 1 |
| 1 | 1 | 1 | 1 | 1 | 0 | 0 | 1 | 1 |
| 1 | 1 | 1 | 1 | 1 | 0 | 1 | 0 | 1 |

In one embodiment of multiplexing circuitry 802, illustrated in FIG. 9, holding circuitry receives the encoded upper two address bits and passes such bits in an inverted and true format to multiplexing circuitry 802. In other words, the holding circuitry inputs inverted first address bit 318, true first address bit 322, inverted second address bit 320 and true second address bit 324 to multiplexing circuitry 802. In one such embodiment, the holding circuitry includes latching circuitry for passing the encoded address bits to multiplexing circuitry 802. In one such embodiment, the number of latches (e.g., two) in such latching circuitry is less than the number of decoded bits being generated by embodiment of the decode logic and counter circuitry (e.g. four).

Advantageously, embodiments of the multiplexing circuitry and equivalents thereof enable the determination of when a page count is complete in a memory array of a memory device with smaller and faster circuitry than previously provided. In particular, embodiments of the multiplexing circuitry uses an encoded and a decoded version of portions of the address to determine whether a page count is complete. Accordingly, the encoded version includes two bits and the decoded version includes four bits. This allowed for embodiments of the multiplexing circuitry wherein an effective gate delay through such circuitry is less than a two gate delay. In particular, the delay through pass gates 912–918 is approximately a one-half gate delay, while the delay through OR gates 920–922 and NAND gate 924 is approximately a one gate delay. Therefore, the gate delay through embodiments of the multiplexing circuitry are less than the gate delay for other count complete circuitry, which typically require a decode-to-decode comparison, thereby resulting in more gates. This conventional circuitry, in turn, has a longer gate delay and is bigger in size.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A memory device comprising:
    a decode logic circuitry capable of decoding a memory address; and
    a counter circuitry coupled to the decode logic circuitry, wherein the counter circuitry is capable of generating a count value based on the decoded memory address, and the decode logic is capable of decoding the memory address prior to the memory address being loaded into the counter circuitry.

2. The memory device of claim 1 further including write drivers connected to the counter circuitry, the write drivers capable of being activated based on the count value.

3. The memory device of claim 1 further comprising a multiplexer coupled to the counter circuitry for receiving the count value and capable of selecting a portion of the count value using a portion of the memory address to determine whether counting by the counter circuitry is completed based on the selected portion of the count value.

4. The memory device of claim 1 further comprising holding circuitry coupled to the multiplexer for holding the portion of the memory address and capable of transmitting the portion of the memory address to the multiplexer.

5. The memory device of claim 1, wherein the memory address is a column address of the memory device.

6. A memory device comprising:
    a decode logic circuitry capable of decoding a memory address; and
    a counter circuitry coupled to the decode logic circuitry, wherein the counter circuitry is capable of generating a count value based on the decoded memory address, and the decode logic is capable of decoding the memory address during setup time of a load path for the memory device.

7. The memory device of claim 6 further including write drivers connected to the counter circuitry, the write drivers capable of being activated based on the count value.

8. The memory device of claim 6 further comprising a multiplexer coupled to the counter circuitry for receiving the count value and capable of selecting a portion of the count value using a portion of the memory address to determine whether counting by the counter circuitry is completed based on the selected portion of the count value.

9. The memory device of claim 6 further comprising holding circuitry coupled to the multiplexer for holding the portion of the memory address and capable of transmitting the portion of the memory address to the multiplexer.

10. The memory device of claim 6, wherein the memory address is a column address of the memory device.

11. A memory device comprising:
    a decode logic circuitry capable of decoding a memory address;
    a counter circuitry coupled to the decode logic circuitry, wherein the counter circuitry is capable of generating a count value based on the decoded memory address, and the decode logic is capable of decoding the memory address during setup time of a load path for the memory device; and
    a plurality of write drivers connected to the counter circuitry, the write drivers being configured in a by-four configuration.

12. The memory device of claim 11, wherein in the by-four configuration, one-fourth of the write drivers capable of being activated simultaneously.

13. The memory device of claim 11, wherein at least one of the writer drivers is capable of being activated to write data to the DRAM based on the count value.

14. A dynamic random access memory (DRAM) comprising:
    a decode logic circuitry capable of decoding a portion of a column address;

a four bit shift register coupled to the decode logic circuitry, the four bit shift register capable of generating a count value based on the decoded portion of the column address; and a number of writer drivers coupled to the four bit shift register for receiving the count value, wherein at least one of the writer drivers is capable of being activated to write data to the DRAM based on the count value.

15. The DRAM of claim 14, wherein the decode logic circuitry is capable of decoding the portion of the column address, and the four bit shift register is capable of generating the count value during setup time of a load path of the DRAM.

16. The DRAM of claim 14, wherein the decode logic circuitry is capable of decoding the address prior to the four bit shift register generating the count value.

17. The DRAM of claim 14, further comprising a multiplexer coupled to the counter circuitry for receiving the count value and capable of selecting a portion of the count value using a portion of the memory address to determine whether counting by the counter circuitry is completed based on the selected portion of the count value.

18. The DRAM of claim 14, further comprising holding circuitry coupled to the multiplexer for holding the portion of the memory address and capable of transmitting the portion of the memory address to the multiplexer.

19. The DRAM of claim 14, wherein the write drivers are in a by-eight configuration.

20. A memory device comprising:

an input buffer capable of receiving a column address for writing data into the memory device;

a decoder coupled to the input buffer, the decoder capable of decoding a portion of the column address the memory device;

a counter coupled to the decoder, the counter capable of generating a count value based on the decoded portion of the column address;

a number of write drivers for receiving the count value, wherein at least one of the writer drivers is capable of being activated based on the count value; and a memory array coupled to the write drivers, the memory array capable of storing the data based on the column address and the number of write drivers being activated, wherein the decoder is capable of decoding the portion of the column address prior to the column address being loaded into the counter.

21. The memory device of claim 20 further comprising a multiplexer coupled to the counter circuitry for receiving the count value and capable of selecting a portion of the count value using a portion of the memory address to determine whether counting by the counter circuitry is completed based on the selected portion of the count value.

22. The memory device of claim 20 further comprising holding circuitry coupled to the multiplexer for holding the portion of the memory address and capable of transmitting the portion of the memory address to the multiplexer.

23. The memory device of claim 22, wherein the multiplexing circuitry is capable of receiving the encoded version of the address from the holding circuitry and a decoded version of the column address from the decoder, and wherein the multiplexing circuitry is capable of using the encoded version to select one bit of the decoded version of the memory address to determine whether the counting by the counter is completed based on the counter value.

24. The memory device of claim 20, wherein the write drivers are in a by-sixteen configuration.

25. A system comprising:

a processor; and a memory device coupled to the processor, wherein the memory device includes:

a decode logic circuitry capable of decoding a memory address; and a counter circuitry coupled to the decode logic circuitry, wherein the counter circuitry is capable of generating a count value based on the decoded memory address, and the decode logic is capable of decoding the memory address prior to the memory address being loaded into the counter circuitry.

26. The system of claim 25 further including write drivers connected to the counter circuitry, the write drivers capable of being activated based on the count value.

27. A system comprising:

a processor; and a memory device coupled to the processor, wherein the memory device includes:

a decode logic circuitry capable of decoding a memory address; and a counter circuitry coupled to the decode logic circuitry, wherein the counter circuitry is capable of generating a count value based on the decoded memory address, and the decode logic is capable of decoding the memory address during setup time of a load path for the memory device.

28. The system of claim 27 further comprising a multiplexer coupled to the counter circuitry for receiving the count value and capable of selecting a portion of the count value using a portion of the memory address to determine whether counting by the counter circuitry is completed based on the selected portion of the count value.

29. The system of claim 27 further comprising holding circuitry coupled to the multiplexer for holding the portion of the memory address and capable of transmitting the portion of the memory address to the multiplexer.

30. The system of claim 27, wherein the memory address is a column address of the memory device.

31. A system comprising:

a processor; and a memory device coupled to the processor, wherein the memory device includes:

a decode logic circuitry capable of decoding a memory address;

a counter circuitry coupled to the decode logic circuitry, wherein the counter circuitry is capable of generating a count value based on the decoded memory address, and the decode logic is capable of decoding the memory address during setup time of a load path for the memory device; and a plurality of write drivers connected to the counter circuitry, the write drivers being configured in a by-four configuration.

32. The system of claim 31, wherein in the by-four configuration, one-fourth of the write drivers are activated simultaneously.

33. A system comprising:

a controller; and a memory device coupled to the controller, wherein the memory device includes:

a decoder capable of decoding a portion of a column address;

a four bit shift register coupled to the decoder, the four bit shift register capable of generating a count value based on the decoded portion of the column address; and a number of writer drivers coupled to the four bit shift register for receiving the count value, wherein at least one of the writer drivers is capable of being activated to write data to the memory device based on the count value.

34. The system of claim 33, wherein the decoder is capable of decoding the portion of the column address, and the four bit shift register is capable of generating the count value during setup time of a load path of the memory device.

35. The system of claim 33, wherein the decoder is capable of decoding the address prior to the four bit shift register generating the count value.

36. The system of claim 33, further comprising a multiplexer coupled to the counter circuitry for receiving the count value and capable of selecting a portion of the count value using a portion of the memory address to determine whether counting by the counter circuitry is completed based on the selected portion of the count. value.

37. The system of claim 33, further comprising holding circuitry coupled to the multiplexer for holding the portion of the memory address and capable of transmitting the portion of the memory address to the multiplexer.

38. The system of claim 33, wherein the write drivers are in a by-eight configuration.

39. A system comprising:
  a controller; and
  a memory device coupled to the controller, wherein the memory device includes:
    an input buffer capable of receiving a column address for writing data into the memory device;
    a decoding circuitry coupled to the input buffer, the decoding circuitry capable of decoding a portion of the column address the memory device;
    a counter circuitry coupled to the decoding circuitry, the counter circuitry capable of generating a count value based on the decoded portion of the column address;
    a number of write drivers for receiving the count value, wherein at least one of the writer drivers is capable of being activated based on the count value; and
    a memory array coupled to the write drivers, the memory array capable of storing the data based on the column address and the number of write drivers being activated, wherein the decoding circuitry is capable of decoding the portion of the column address prior to the column address being loaded into the counter circuitry.

40. The system of claim 39, further comprising a multiplexer coupled to the counter circuitry for receiving the count value and capable of selecting a portion of the count value using a portion of the memory address to determine whether counting by the counter circuitry is completed based on the selected portion of the count value.

41. The system of claim 39, further comprising holding circuitry coupled to the multiplexer for holding the portion of the memory address and capable of transmitting the portion of the memory address to the multiplexer.

42. The system of claim 41, wherein the multiplexing circuitry is capable of receiving the encoded version of the address from the holding circuitry and a decoded version of the column address from the decoding circuitry, and wherein the multiplexing circuitry is capable of using the encoded version to select one bit of the decoded version of the memory address to determine whether the counting by the counter circuitry is completed based on the counter value.

43. The system of claim 39, wherein the write drivers are in a by-sixteen configuration.

44. A compare circuit for determining whether a page count is complete in a memory structure, the compare comprising:
  a storage unit including a number of latches, the latches capable of holding an encoded version of a memory address;
  a multiplexor coupled to the storage unit for receiving the encoded version of the memory address from the storage unit and a decoded version of the memory address from a decoder, wherein the multiplexor is capable of using the encoded version to select one bit of the decoded version of the memory address to determine whether the page count is complete for the memory structure.

45. The compare circuit of claim 44, wherein the encoded version includes two bits and the decoded version includes four bits, and wherein an effective gate delay through the multiplexor is less than a two gate delay.

46. The compare circuit of claim 44, wherein each bit of the encoded version of the memory address is not compared with each bit of the decoded version of the memory address to determine whether the page count is complete for the memory structure.

47. The compare circuit of claim 44, wherein the number of latches is less than a number of decoded bits in the decoded version of the memory address.

48. A system comprising:
  a controller; and
  a memory device coupled to the controller, wherein the memory device includes:
    an input buffer capable of receiving a column address for writing data into the memory device;
    a decoding circuitry coupled to the input buffer, the decoding circuitry capable of decoding a portion of the column address that of the memory device;
    a counter circuitry coupled to the decoding circuitry, wherein the counter circuitry is capable of generating a count value based on the decoded portion of the column address, and the decoding circuitry is capable of decoding the column address prior to the memory address being loaded into the counter circuitry;
    a holding circuitry coupled to the input buffer for holding an encoded version of the column address;
    a multiplexor coupled to the holding circuitry and the counter circuitry for receiving the encoded version of the memory address from the holding circuitry and a decoded version of the memory address from the counter circuitry, wherein the multiplexor is capable of using the encoded version of the column address to select one bit of the decoded version of the column address to determine whether a page count is complete for the memory device;
    a number of write drivers coupled to the counter circuitry for receiving the count value, wherein at least one of the writer drivers is capable of being activated based on the count value; and
    a memory array coupled to the write drivers, the memory array capable of storing the data based on the column address and the number of write drivers being activated, wherein the decoder is capable of decoding the portion of the column address prior to the column address being loaded into the counter circuitry.

49. The system of claim 48, wherein the encoded version includes two bits and the decoded version includes four bits, and wherein an effective gate delay through the multiplexor is less than a two gate delay.

50. The system of claim 48, wherein each bit of the encoded version of the memory address is not compared with each bit of the decoded version of the memory address to determine whether the page count is complete for the memory structure.

51. A method of operating a memory device, the method comprising:
- receiving a memory address;
- decoding the memory address to produce decoded memory address;
- generating a count value based on the decoded memory address;
- activating a write driver based on the count value; and
- writing data from the write driver into memory cells of the memory device.

52. The method of claim 51, wherein receiving a memory address includes receiving a column address.

53. The method of claim 51, wherein decoding the memory address includes decoding a portion of the memory address that controls write drivers and sense amplifiers of the memory device.

54. The method of claim 51, wherein decoding the memory address includes decoding four bit of the memory address.

55. The method of claim 51, wherein generating a count value including loading the memory address into a counter, wherein decoding the memory address occurs before the memory address is loaded into the counter.

56. The method of claim 51 further includes selecting one bit of the decoded version of the address based on an encoded version of the memory address to determine whether a page count is complete for the memory device.

* * * * *

UNITED STATES PATENT AND TRADEMARK OFFICE
CERTIFICATE OF CORRECTION

PATENT NO. : 6,442,096 B2
DATED : August 27, 2002
INVENTOR(S) : Huber

It is certified that error appears in the above-identified patent and that said Letters Patent is hereby corrected as shown below:

Column 1,
Line 31, delete "wit[0088]" and insert -- with --, therefor.

Signed and Sealed this

First Day of July, 2003

JAMES E. ROGAN
*Director of the United States Patent and Trademark Office*